United States Patent [19]

Kanda et al.

[11] Patent Number: 5,204,575
[45] Date of Patent: Apr. 20, 1993

[54] SURFACE ACOUSTIC WAVE RESONATOR

[75] Inventors: Tadashi Kanda; Koji Asano; Hiroshi Shimizu, all of Sendai; Yuji Suzuki, Kofu, all of Japan

[73] Assignee: Kokusai Electric Co., Ltd., Tokyo, Japan

[21] Appl. No.: 770,178

[22] Filed: Oct. 2, 1991

[30] Foreign Application Priority Data

Oct. 15, 1990 [JP] Japan .................. 2-275888

[51] Int. Cl.⁵ .................................... H01L 41/08
[52] U.S. Cl. .................. 310/313 B; 310/313 D; 333/195
[58] Field of Search ............ 310/313 B, 313 D; 333/195

[56] References Cited

U.S. PATENT DOCUMENTS

| | | | |
|---|---|---|---|
| 4,206,380 | 6/1980 | Hazama et al. | 310/313 R |
| 4,322,651 | 3/1982 | Inoue et al. | 310/313 B |
| 4,388,600 | 6/1983 | Wakino et al. | 310/313 R |
| 4,634,913 | 1/1987 | Whatmore et al. | 310/313 D |

FOREIGN PATENT DOCUMENTS

| | | | |
|---|---|---|---|
| 0061318 | 4/1982 | Japan | 333/195 |
| 0200814 | 9/1987 | Japan | 333/195 |

*Primary Examiner*—Mark O. Budd
*Assistant Examiner*—Thomas M. Dougherty
*Attorney, Agent, or Firm*—Emmanuel J. Lobato; Robert E. Burns

[57] ABSTRACT

A surface acoustic wave resonator having an interdigital transducer on a piezoelectric substrate. Grating reflectors, which have electrode strips of the same width and the same pitch as those of electrodes of the interdigital transducer and of a number smaller than 1/5 that of said electrodes of said interdigital transducer, are disposed at the intervals equal to said pitch at both sides of said interdigital transducer on a surface wave propagation path. The electrode portion of the interdigital transducer is weighted so that the aperture of the interdigital transducer is maximum at the center of the interdigital transducer and uniformly decreases toward its both sides along respective sides of a rhombus with its vertices at the centers of the outermost electrode strips of the grating reflectors.

3 Claims, 9 Drawing Sheets

SURFACE ACOUSTIC WAVE RESONATOR

BACKGROUND OF THE INVENTION

The present invention relates to a surface acoustic wave resonator of the type having an interdigital transducer on a piezoelectric substrate.

A Love wave type surface acoustic wave resonator will be described as a typical prior art example. There has been proposed a Love wave (SH wave) type surface acoustic wave resonator. In this case, an electromechanical coupling coefficient of a Love wave is far larger than that of a Rayleigh wave (P+SV wave) (see Japanese Pat. Pub. Disc. No. 260213/88).

In the Love wave type surface acoustic wave resonator the Rayleigh wave becomes a spurious mode, but as is wellknown in the art, even if other surface acoustic waves than the Love wave (the Rayleigh wave, for example) are used, a surface acoustic wave resonator can be formed by providing a large number of IDT electrodes on the piezoelectric substrate. In this instance, the Rayleigh wave is not a spurious mode, but the longitudinal mode and the transverse mode are still spurious ones as in the case of the Love wave type surface acoustic wave resonator.

SUMMARY OF THE INVENTION

An object of the present invention is to provide a surface acoustic wave resonator, which obviates the above-mentioned defects and suppresses spurious response resulting from the longitudinal and transverse modes and the Rayleigh wave in case of utilizing the Love wave type surface acoustic waves, and has a high Q value.

To attain the above object of the present invention, a surface acoustic wave resonator having an interdigital transducer on a piezoelectric substrate is provided, characterized in that grating reflectors, which have electrode strips of the same width and the same pitch as those of electrodes of said interdigital transducer and of a number smaller than 1/5 that of said electrodes of said interdigital transducer, are disposed at the intervals equal to said pitch at both sides of said interdigital transducer on a surface wave propagation path; and that the electrode portion of said interdigital transducer is weighted so that the aperture of said interdigital transducer is maximum at the center of said interdigital transducer and uniformly decreases toward its both sides along respective sides of a rhombus with its vertices at the centers of the outermost electrode strips of said grating reflectors.

A Love wave type surface acoustic wave resonator having an interdigital transducer formed of a heavy metal on a high coupling piezoelectric substrate cut at a specific angle of rotation is further provided, characterized in that grating reflectors, which have electrode strips of the same width and the same pitch as those of electrodes of said interdigital transducer and of a number smaller than 1/5 that of said electrodes of said interdigital transducer, are disposed at the intervals equal to said pitch at both sides of said interdigital transducer on a surface wave propagation path; and that the electrode portion of said interdigital transducer is weighted so that the aperture of said interdigital transducer is maximum at the center of said interdigital transducer and uniformly decreases toward its both sides along respective sides of a rhombus with its vertices at the centers of the outermost electrode strips of said grating reflectors.

BRIEF DESCRIPTION OF THE DRAWINGS

The present invention will be described in detail below in comparison with prior art with reference to the accompanying drawings, in which.

DETAILED DESCRIPTION

To make differences between prior art and the present invention clear, prior art will first be described.

Figure 1:
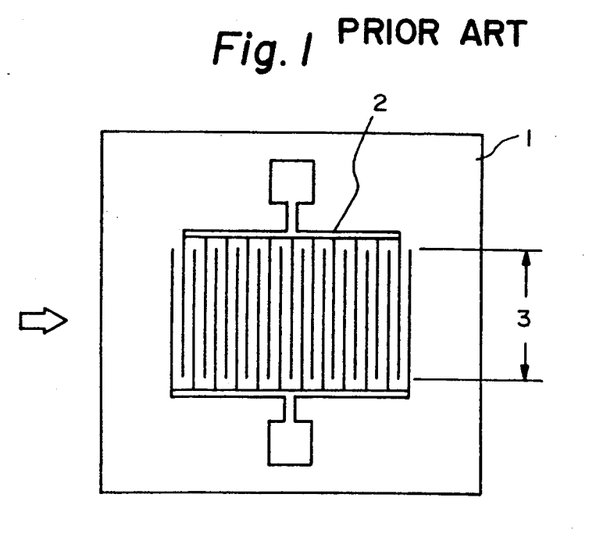
FIG. 1 is a diagram schematically showing an example of the structure of a conventional Love wave type surface acoustic wave resonator.
Figure 2:
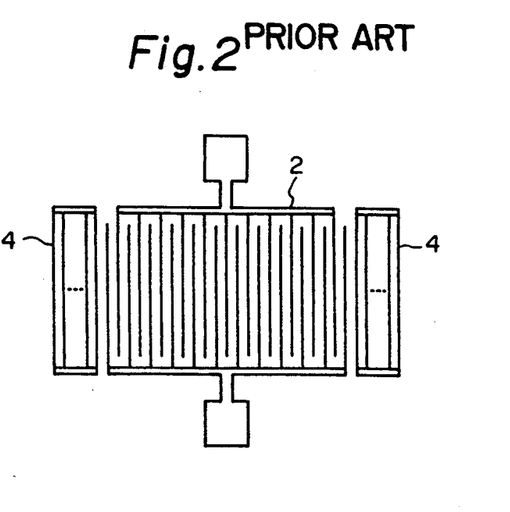
FIG. 2 is a diagram schematically showing an example of the structure of a conventional Love wave type surface acoustic wave resonator with reflectors.

FIG. 1 is a plan view showing an example of the structure of the conventional Love wave type surface acoustic wave resonator. In FIG. 1, reference numeral 1 denotes a piezoelectric substrate, 2 an interdigital transducer (hereinafter referred to as IDT) and 3 the aperture of the interdigital transducer of its electrodes. The arrow indicates the traveling direction of Love wave type surface acoustic waves. In FIG. 2 and the following drawings, the piezoelectric substrate will be omitted unless otherwise specified.

With such a structure as shown in FIG. 1 in which interdigital electrodes as of gold (Au), silver (Ag), platinum (Pt), or similar heavy metal are deposited on the piezoelectric substrate 1 as of rotated Y cut $LiNbO_3$, so that a leaky pseudo surface acoustic waves can be transformed to non-leaky Love wave type surface waves and a surface acoustic wave resonator is formed by only the IDT which converts electric signals to surface acoustic waves.

The resonator of the structure depicted in FIG. 1 forms a waveguide for the surface acoustic waves, and hence has a shortcoming a that inharmonic resonance modes exist in the travelling direction of the surface acoustic waves (in the longitudinal direction indicated by the arrow in FIG. 1) and a direction perpendicular thereto, respectively, and become spurious response. Another disadvantage of this structure is that Rayleigh wave type surface acoustic waves, though slightly, are induced in the rotated Y cut $LiNbO_3$ substrate and also become a spurious response.

Furthermore, the structure of FIG. 1 is defective in that Q of the resonator does not increase, because acoustic surface wave energies are radiated to the outside of the IDT 2 from the electrodes near its both ends.

In general, in case of constructing a voltage controlled oscillator (VCO), the surface acoustic wave resonator is required to be free from the afore-mentioned inharmonic longitudinal and transverse spurious modes and to have a high Q value so as to increase the carrier to noise ratio (C/N).

With the conventional structure shown in FIG. 1, since the surface acoustic wave energies are radiated to the outside of the IDT 2 from the electrodes near its both ends, the Q of resonator decreases. In view of this, a grating reflector 4 is disposed at either side of the IDT 2 to increase the Q. FIG. 2 shows an example of such a structure. The number of strips of the grating reflector may be several. The reason for this is that since the Love wave type acoustic surface wave has very high electro-mechanical coupling coefficient ($K^2$), the reflection coefficient per strip is very large, and an increase in the number of strips of the reflector deteriorates the capacitance ratio of the resonator.

Figure 3A:
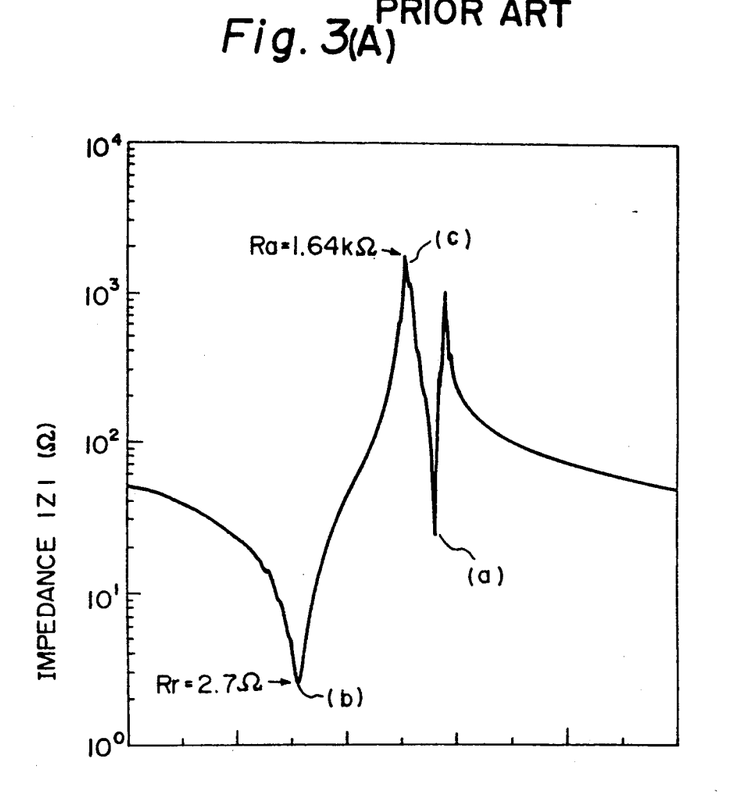
FIGS. 3A, 3B, 7A, 7B, 8A and 8B are graphs showing frequency characteristics in impedance and phase angle of resonator of the structure shown in FIG. 1.
Figure 3B:
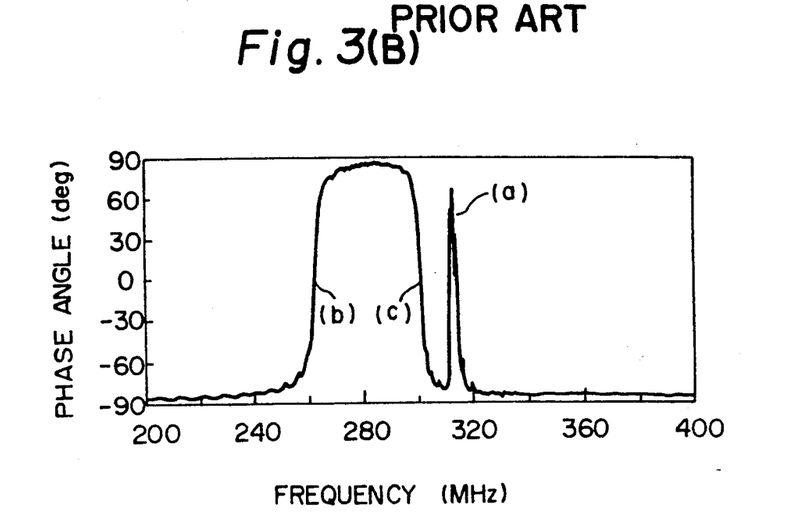

FIG. 3 is a graph showing, by way of example, frequency characteristics of impedance and phase angle in the conventional resonator depicted in FIG. 1, where (b) indicates a resonance frequency, (C) an anti-resonance frequency, and (a) a spurious response. Details of the specimen are as follows: the piezoelectric substrate is Y cut-X prop. $LiNbO_3$, the number of pairs of IDT electrodes is 30, the pitch P of the electrodes is 5 $\mu$m, the aperture length of the IDT is $45\lambda_0$ (where $\lambda_0=2P$), and the electrodes are made of gold (Au) and are 4950 Å in thickness.

Figure 4A:
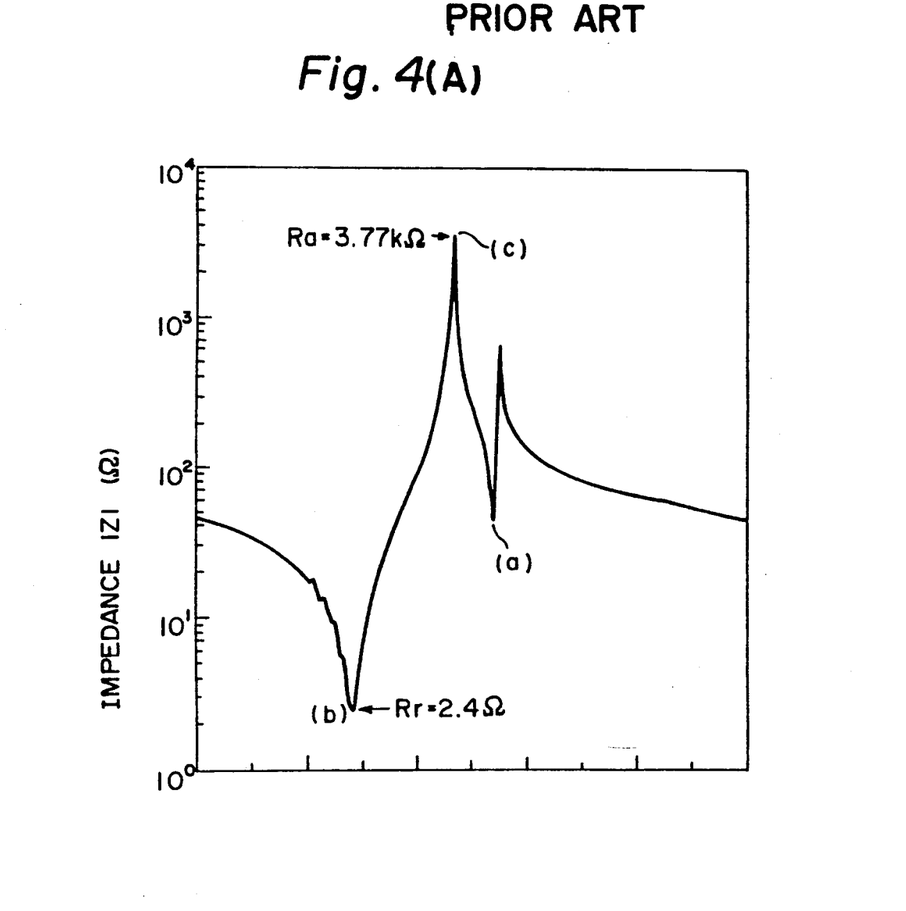
FIGS. 4A and 4B are graphs showing frequency characteristics in impedance and phase angle of the resonator of the structure depicted in FIG. 2.
Figure 4B:
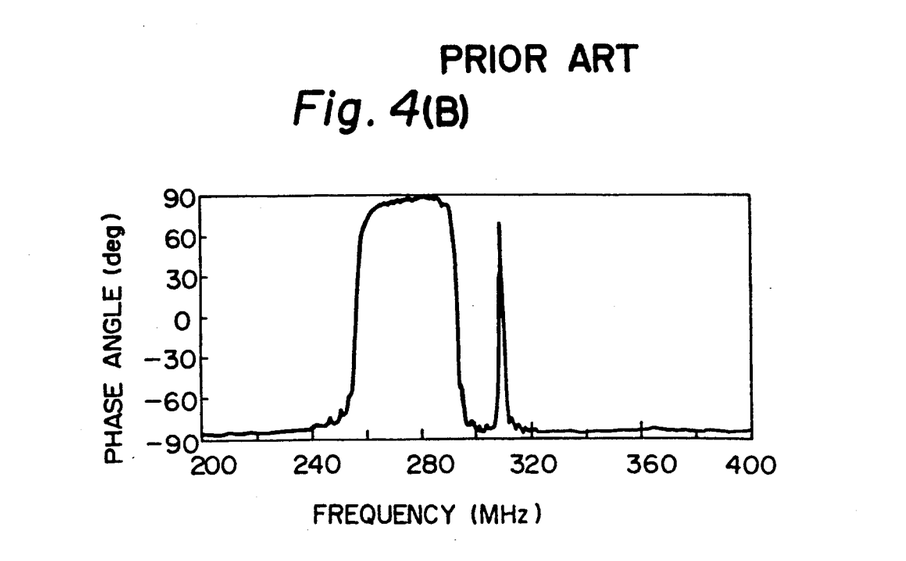

FIG. 4 is a graph showing, by way of example, frequency characteristics of impedance and phase angle in the resonator of the structure depicted in FIG. 2, in which the reflector 4 having five electrode strips is provided at either side of the IDT 2 in FIG. 1.

Comparison of FIGS. 3 and 4 indicates that the resonance resistance Rr is reduced to 2.4 $\Omega$ from 2.7 $\Omega$ and that the antiresonance resistance Ra is increased from 1.64 k$\Omega$ to 3.77 k$\Omega$. That is, the ratio of the resonance resistance to the antiresonance resistance, [20 log (Ra/Rr)], which is a measure of the Q, is increased from 55.7 dB to 63.9 dB, by which the Q is improved. However, as will be seen from the frequency characteristics of the resonator phase angle shown in FIGS. 3(B) and 4(B), no improvements are achieved on ripples which are caused by the inharmonic longitudinal and transverse modes over the frequency range from the lower side of the resonance frequency (b) toward the anti-resonance frequency (c).

Figure 5:
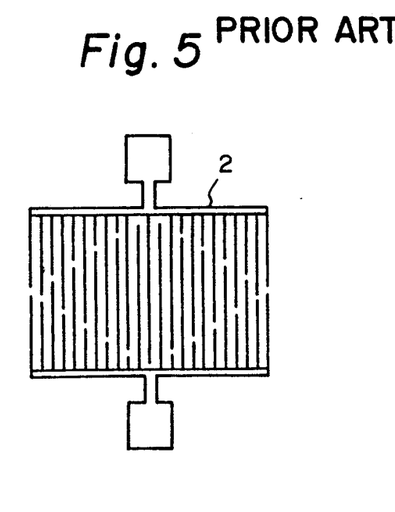
FIG. 5 is a diagram schematically showing an example of the structure of a conventional weighted IDT Love wave type surface acoustic wave resonator.
Figure 6A:
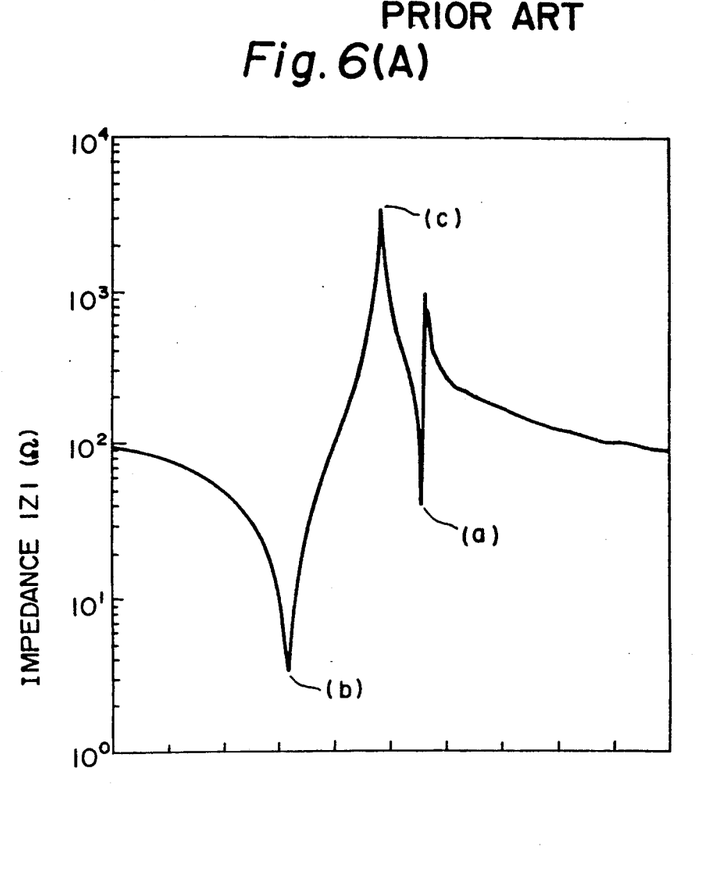
FIGS. 6A and 6B are graphs showing frequency characteristics in impedance and phase angle of the resonator of the structure depicted in FIG. 5.
Figure 6B:
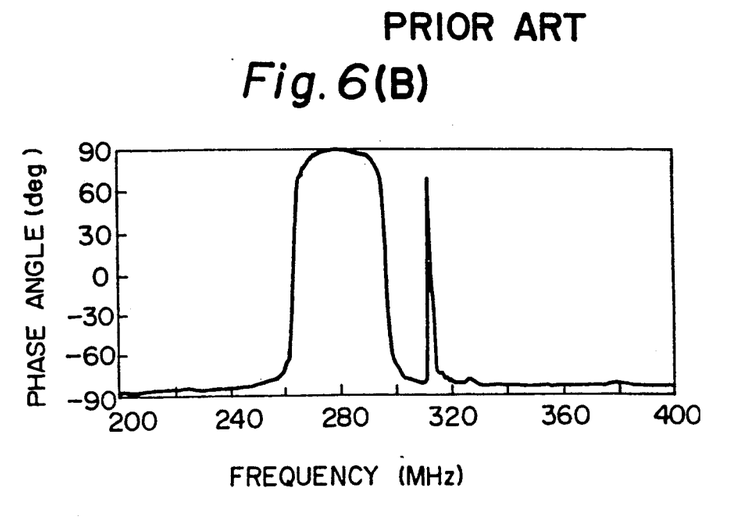

FIG. 5 shows a resonator structure designed to suppress the spurious response resulting from such inharmonic longitudinal and transverse modes. The spurious response can be suppressed by weighting the IDT 2 in such a rhombic form that the aperture of the IDT is maximum at the center thereof and becomes more narrow so as to tend toward zero at the both ends thereof as shown in FIG. 5. FIG. 6 is a graph showing, by way of example frequency characteristics in impedance and phase angle of the resonator with such a weighted IDT as depicted in FIG. 5. The number of electrode pairs and other conditions are the same as in the case of FIG. 3. It is seen from FIG. 6(B) that the ripples resulting from the spurious modes over the frequency range from the lower side of the resonance frequency toward the anti-resonance frequency, appearing in FIG. 3, are suppressed. With the structure shown in FIG. 5, since the IDT is weighted so that the aperture of the IDT is maximum at the center of the IDT and becomes more narrow so as to tend toward zero at both ends of the IDT, less energy is lost due to outward radiation from the electrodes near its both ends, and consequently, the Q value is larger than in the case of FIG. 3. However, the spurious response (a) resulting from the Rayleigh wave is not eliminated as shown in FIGS. 3 and 4.

Next, a description will be given of a method for suppressing the spurious response resulting from the Rayleigh wave.

Figure 7A:
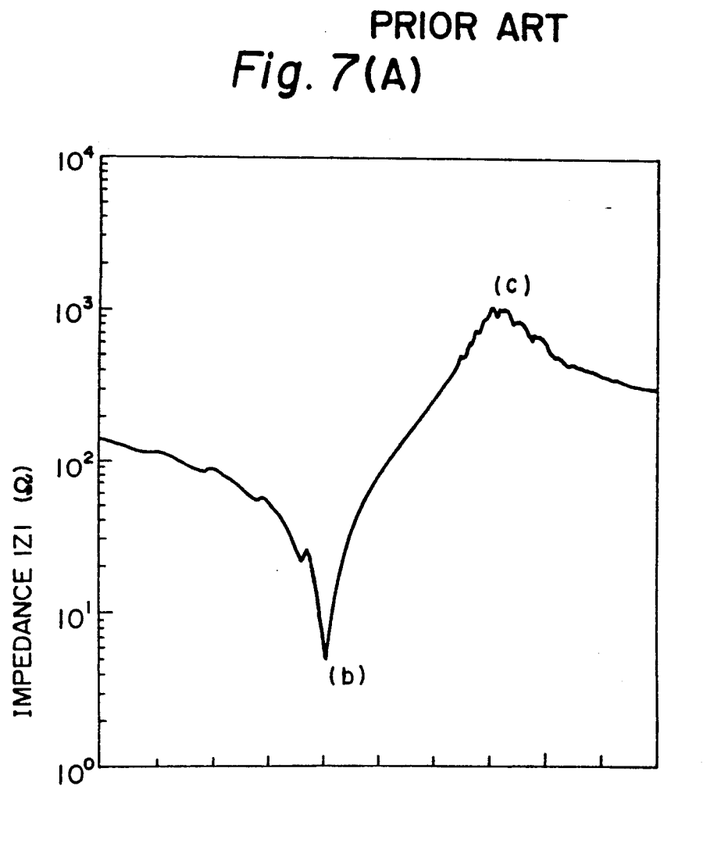
Figure 7B:
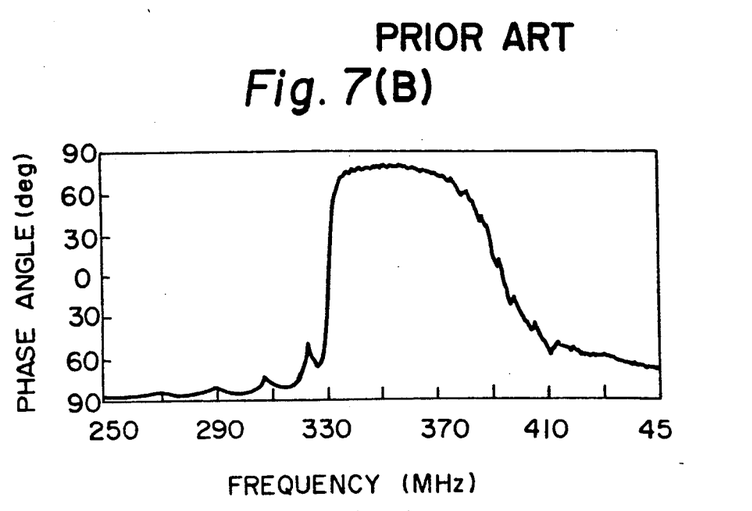
Figure 8A:
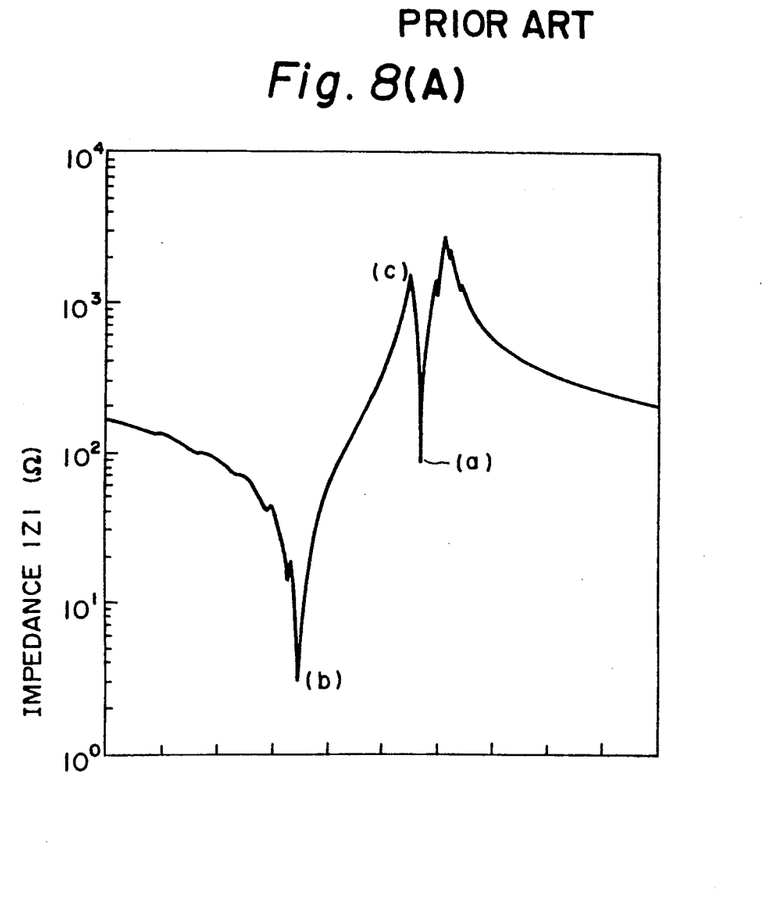
Figure 8B:
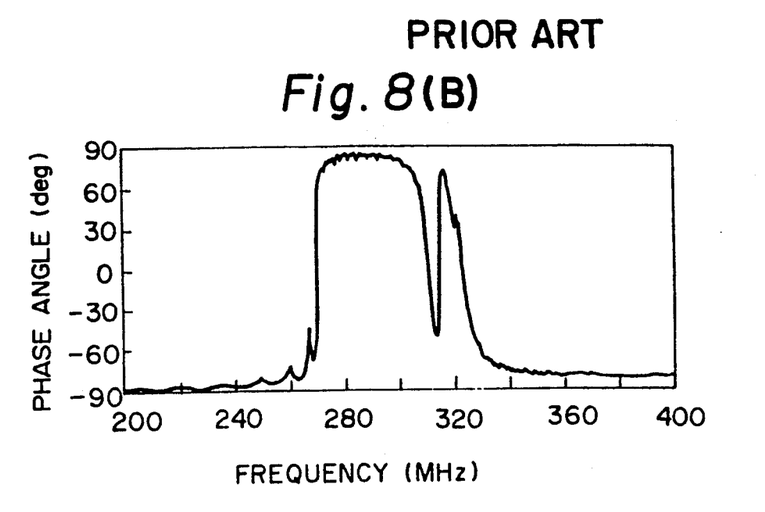

FIGS. 7 and 8 are graphs showing frequency characteristics in impedance and phase angle of the conventional resonators of the structure depicted in FIG. 1, in which the piezoelectric substrate is a Y cut-X prop. $LiNbO_3$, the number of IDT electrode pairs is 15, the electrode pitch P' is 5 $\mu$m and the aperture length of the IDT is $30\lambda'_0$ (where $\lambda'_0=2P'$) but the electrode thickness is 2300 Å in FIG. 7 and 4280 Å in FIG. 8. Comparison of the both figures that the spurious response (a) resulting from the Rayleigh wave is seen in FIG. 8 in which the electrode is thicker than the other, but such a response is not seen in FIG. 7. It can be understood, however, that the Q value becomes lower when electrode thickness decreases.

Figure 9:
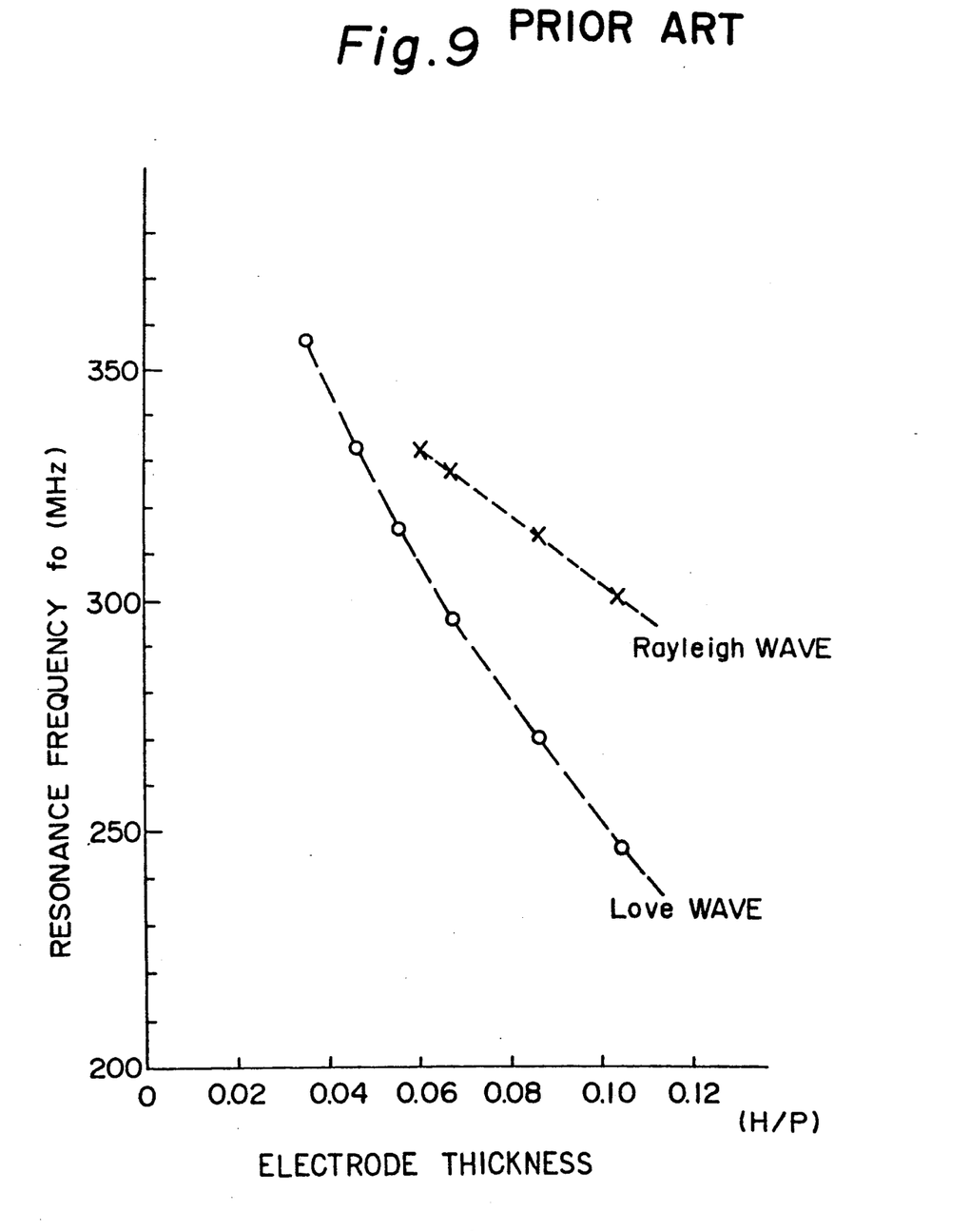
FIG. 9 is a graph showing the relationship of the resonance frequency to the electrode thickness.

FIG. 9 is a graph showing the relationship of the resonance frequency $f_r$ to the electrode thickness H, the abscissa being normalized with the electrode pitch P. It was found experimentally that the spurious response resulting from the Rayleigh wave resonance mode decreases as the thickness of the electrode becomes thinner and that when the normalized electrode thickness H/P is 0.05 (5%) or below, substantially no such spurious response appears.

In the Love wave type surface acoustic wave resonator the Rayleigh wave becomes spurious mode, but as is well-known in the art, even if other surface acoustic waves than the Love wave (the Rayleigh wave, for example) are used, a surface acoustic wave resonator can be formed by providing a large number of IDT electrodes on the piezoelectric substrate. In this instance, the Rayleigh wave is not spurious mode, but the longitudinal mode and the transverse mode are still spurious ones as in the case of the Love wave type surface acoustic wave resonator.

With reference to the accompanying drawings, the present invention will hereinafter be described in detail.

The Love wave type surface acoustic wave resonator will be described as typical example of the invention.

Figure 10:
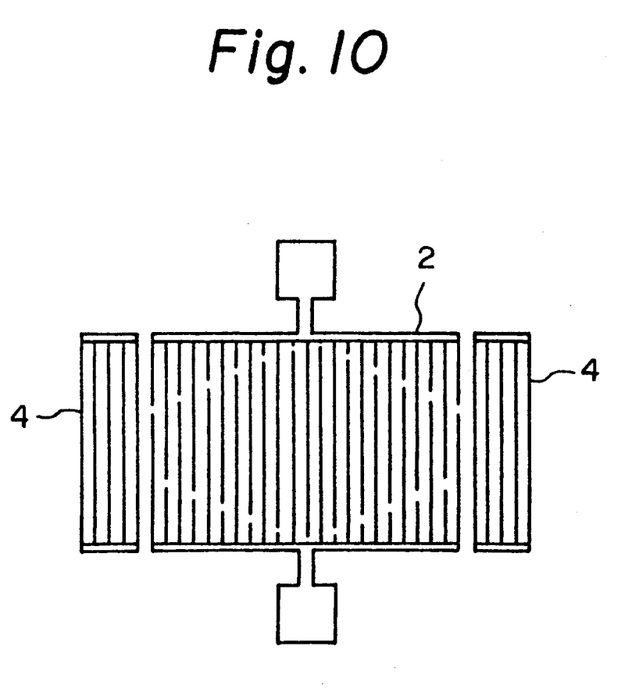
FIG. 10 is a graph illustrating an example of the structure of the Love wave type surface acoustic wave resonator according to the present invention.

FIG. 10 is a plan view illustrating the electrode structure of the Love wave type surface acoustic wave resonator in accordance with an embodiment of the present invention, the piezoelectric substrate being omitted. In FIG. 10, the IDT 2 is disposed along the travelling direction of surface acoustic waves and the grating reflector 4 having several electrode strips is disposed at either side of the IDT 2. The IDT 2 is weighted so that the aperture of the IDT is maximum at the center thereof and linearly decreases toward its opposite ends along respective sides of a rhombus with its vertices at the centers of the outermost electrodes of the opposite grating reflectors 4; that is, this structure is characterized in that the aperture of the IDT is not reduced to zero at either side of the IDT 2.

In other words, this structure has its feature in that several pairs of electrodes at the opposite ends of the rhombic weighted IDT 2 are weighted zero, electrically disconnected and replaced with short-circuit strip electrodes, i.e. the grating reflectors 4.

With the Love wave type surface acoustic wave resonator of the present invention, shown in FIG. 10, surface acoustic waves excited by the IDT 2 are subjected to multiple reflection, because the interdigital electrodes themselves operate as reflectors, and the surface acoustic waves radiated from the opposite ends of the IDT 2 are further subjected to multiple reflection by the reflectors 4 each disposed at the same pitch with the IDT 2 at either end thereof and having a several number of electrodes, resulting in an improved energy trapping effect, and hence increases the Q value of the resonator. In addition, the aperture of the IDT is weighted along each side of a rhombus formed along a line joining the centers of respective sides of a surface acoustic waveguide including the reflectors 4 so that the weighted IDT does not couple with the inharmonic longitudinal and transverse modes resulting from the formation of the surface acoustic waveguide.

To suppress the spurious response resulting from the Rayleigh wave (a), the thickness H of the electrodes is set to a value equal to or smaller than the ratio, $H/Pi=0.05$, normalized by the electrode pitch $Pi$.

Figure 11A:
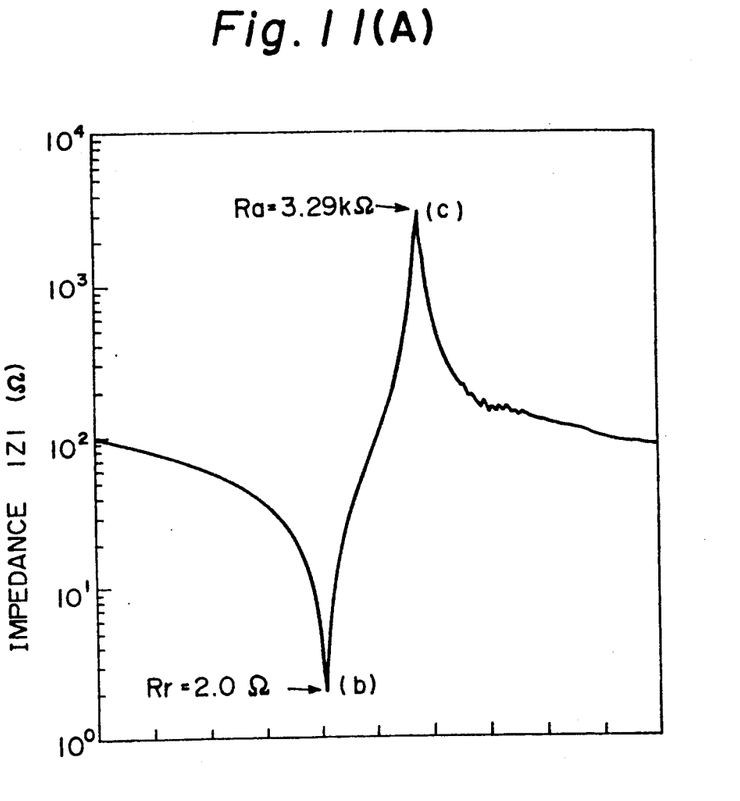
FIGS. 11A and 11B are graphs showing frequency characteristics in impedance and phase angle of the resonator of the structure depicted in FIG. 10.
Figure 11B:
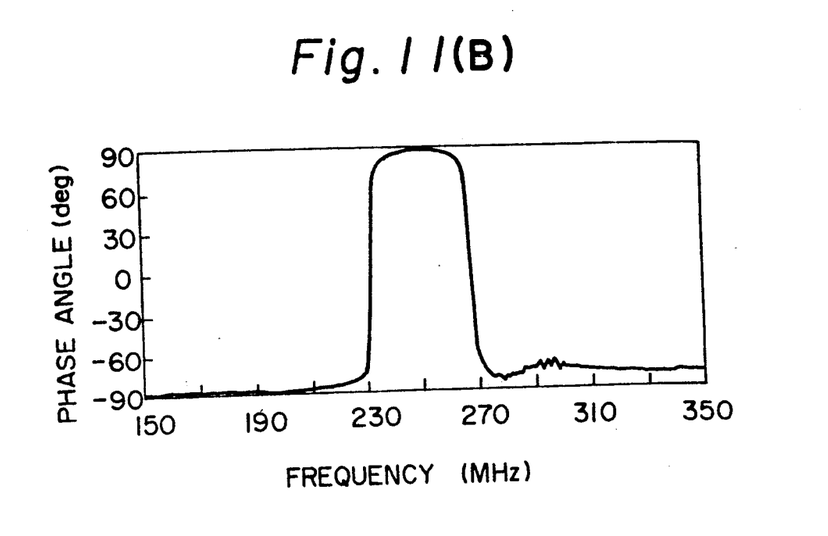

FIG. 11 is a graph showing frequency characteristics in impedance and phase angle of the resonator of the FIG. 10 structure according to the present invention. The number of IDT electrode pairs is 50, the number of reflector electrode strips is 5, the IDT electrodes are made of gold (Au), the IDT electrode pitch $P''$ is 7.1 μm, the maximum aperture length of the IDT is $26\lambda''_0$ (where $\lambda''_0=2P''$) and the thickness of the IDT electrodes is 3380 Å. The spurious response resulting from the longitudinal and transverse modes and the Rayleigh wave are suppressed. The resonance resistance $Rr$ is 2.0 Ω and the anti-resonance resistance $Ra$ is 3.29 kΩ, and consequently, their level difference [20 log $(Ra/Rr)$] is 64 dB and a very high Q value is obtained.

It is evident that the same results as mentioned above are also obtainable with surface acoustic wave resonators other than the Love wave type one. In this case, the number of IDT electrode pairs comes to be very large, because the electro-mechanical coupling coefficient $K^2$ is far lower than that of the Love wave type surface acoustic wave.

The effect of the present invention could be fully produced, so long as the number of electrode strips of the grating reflectors is smaller than 1/5 the number of interdigital electrodes of the IDT.

As described above in detail, the present invention permits realization of a surface acoustic wave resonator, which has no spurious of the longitudinal and transverse modes and no spurious by the Rayleigh wave in the case of using the Love wave type surface acoustic wave, and which has a high Q value.

What we claim is:

1. A surface acoustic wave resonator having an interdigital transducer on a piezoelectric substrate, characterized in:

that grating reflectors, which have electrode strips of the same width and the same pitch as those of electrodes of said interdigital transducer and of a number smaller than 1/5 that of said electrodes of said interdigital transducer, are disposed at the intervals equal to said pitch at both sides of said interdigital transducer on a surface wave propagation path; and that the electrode portion of said interdigital transducer is weighted so that the aperture of said interdigital transducer is maximum at the center of said interdigital transducer and uniformly decreases toward its both sides along respective sides of a rhombus with its vertices at the centers of the outermost electrode strips of said grating reflectors.

2. A Love wave type surface acoustic wave resonator having an interdigital transducer formed of a heavy metal on a high coupling piezoelectric substrate cut at a specific angle of rotation, characterized in:

that grating reflectors, which have electrode strips of the same width and the same pitch as those of electrodes of said interdigital transducer and of a number smaller than 1/5 that of said electrodes of said interdigital transducer, are disposed at the intervals equal to said pitch at both sides of said interdigital transducer on a surface wave propagation path; and that the electrode portion of said interdigital transducer is weighted so that the aperture of said interdigital transducer is maximum at the center of said interdigital transducer and uniformly decreases toward its both sides along respective sides of a rhombus with its vertices at the centers of the outermost electrode strips of said grating reflectors.

3. A Love wave type surface acoustic wave resonator according to claim 2, characterized in that the thickness of said electrodes of said interdigital transducer is smaller than 5% of the electrode pitch of said interdigital transducer.

* * * * *